United States Patent
Brown et al.

[11] Patent Number: 5,885,367
[45] Date of Patent: Mar. 23, 1999

[54] RETRACTABLE THIN FILM SOLAR CONCENTRATOR FOR SPACECRAFT

[75] Inventors: Michael A. Brown, Columbia; Brian Whalen, Silver Spring, both of Md.

[73] Assignee: The United States of America as represented by the Secretary of the Navy, Washington, D.C.

[21] Appl. No.: 813,074

[22] Filed: Mar. 7, 1997

[51] Int. Cl.[6] ........................................... H01L 25/00
[52] U.S. Cl. ......................... 136/245; 136/246; 136/292
[58] Field of Search .................................. 136/245, 246, 136/292

[56] References Cited

U.S. PATENT DOCUMENTS

| | | | |
|---|---|---|---|
| 4,784,700 | 11/1988 | Stern et al. | 136/248 |
| 5,344,496 | 9/1994 | Stern et al. | 136/246 |
| 5,520,747 | 5/1996 | Marks | 136/245 |

Primary Examiner—Mark Chapman
Attorney, Agent, or Firm—Thomas E. McDonnell; Charles J. Stockstill

[57] ABSTRACT

A solar concentrator having flexible retractable reflector panels of a thin plastic film coated with aluminum or silver configured as a trough along the long edges of the solar panel and tilted so as to direct the reflected sunlight onto the solar panel in such a manner that the ray from the extreme outer edge of a reflector panel will fall on the edge of the opposite side of the solar panel, resulting in an even distribution of reflected sunlight on the solar panel for optimum performance. The flexible reflector panels are stowed during launch by rolling them around the booms or around themselves. For launch, the booms with the reflector panel rolled thereon, are stowed against the long edges of the solar panel. After launch, the booms are extended to a an angular position respective to the solar panel, by a system of pulleys and wires that keep tension on the reflector panels as the reflector panels are deployed as the plurality of sections of the solar panel are extended to a flat position.

7 Claims, 4 Drawing Sheets

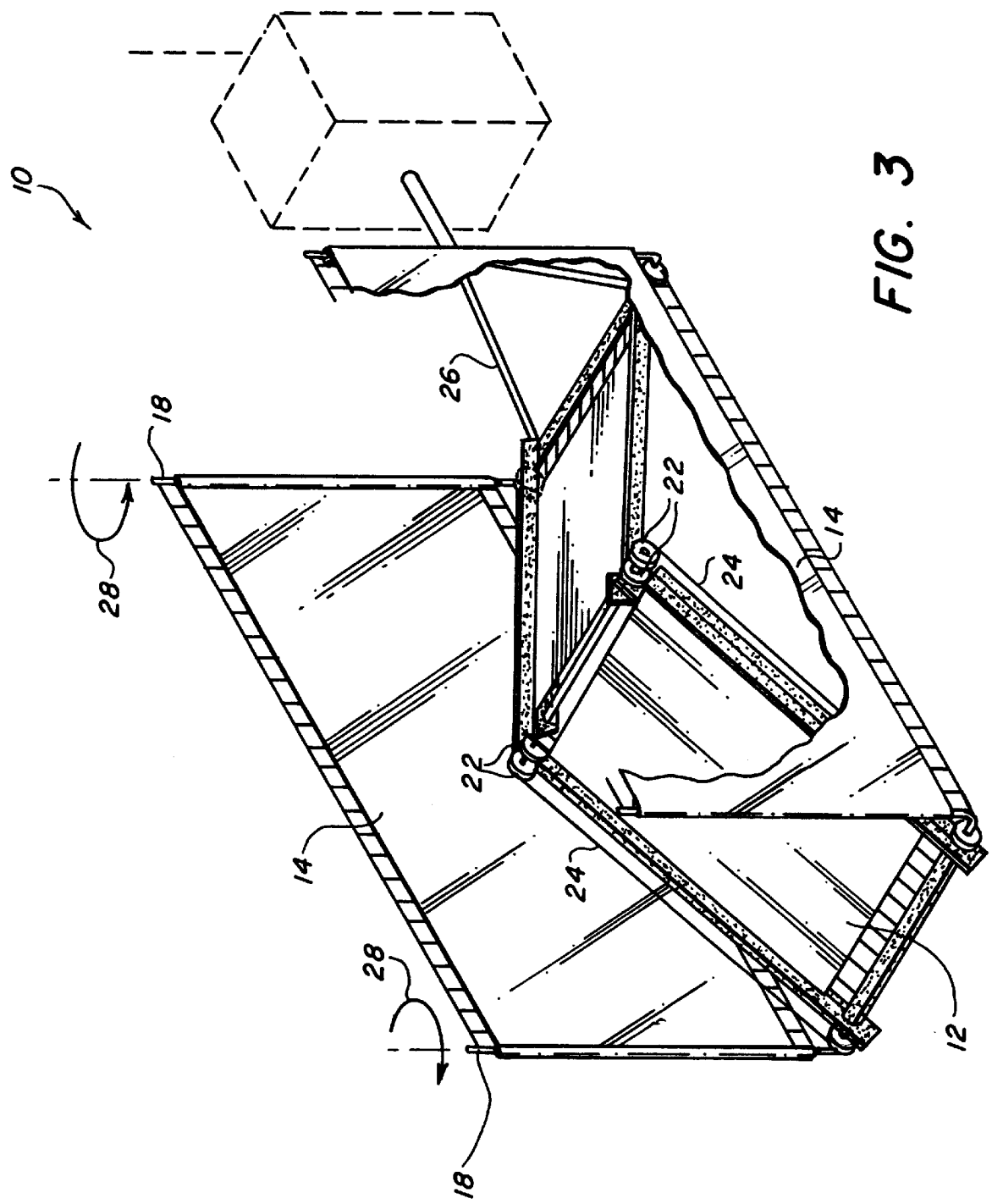

RETRACTABLE THIN FILM SOLAR CONCENTRATOR FOR SPACECRAFT

BACKGROUND OF THE INVENTION

1. Field of the Invention

This invention pertains generally to a solar concentrator and more particularly to a low power solar concentrator having thin film reflective panels for use on a spacecraft.

2. Description of the Related Art

Most satellites generate electric power in space by exposing solar panels—flat panels of photovoltaic cells—to the Sun. One way to increase the power from a solar panel is to use reflectors to direct additional sunlight onto the solar panel. For example, doubling the amount of sunlight onto the panel would approximately double the electric power output of the panel. (This power increase is always less than directly proportional to the increase in incident sunlight because the increased sunlight raises the temperature of the cells which in turn decreases their efficiency.) The measure of effectiveness is the increase in specific power, that is, the power output of the augmented solar arrays, divided by the mass of the solar panels plus reflectors. This ratio should be substantially greater than the power of the unaugmented panel divided by its own mass. Therefore, it is evident that the added reflectors should be extremely light.

Solar concentrators utilized on spacecraft can be divided into three categories depending on their concentration ratio, that is, the ratio of area of sunlight gathered to the area of photovoltaic cells on which the sunlight is concentrated. First a parabolic reflector is used in high concentration systems (those with a concentration of approximately 50:1 or more). Secondly, Fresnel lenses for use in medium concentrator systems (concentrations in the range of 10:1 to 25:1), and thirdly, the trough type described in this invention for use in low power concentrators with a ratio less than 3:1. Because of the heat generated, the first two types require a special cooling means for the photovoltaic cells.

In normal operation, the solar panels are capable of being folded and stowed against the sides of the spacecraft during launch to minimize the spacecraft volume and to protect the fragile panel from launch loads and vibrations. Once in orbit, the panels and reflectors are unfolded, as in the third case, to form a trough configuration.

Further, the reflector must be flat in order to provide an even distribution of sunlight across the solar panel since any irregularities decrease the power output of the panel. In the prior art, flatness was achieved by using rigid reflectors which resulted in excessive mass for the system. Further, in the case of the trough reflector configuration, the prior art is limited in that the width of the rigid reflector is limited to, at most, the width of the solar panel because the rigid reflector panel must fold against the photovoltaic panel during launch. This limits the concentration ratio. Further, the solar panel cannot produce electric power until it deploys after reaching its final orbit if the reflector panel covers the outside of the stowed solar panel. Higher concentrations can be achieved by having rigid reflectors with double folds, but this increases the mass and complexity of the system.

SUMMARY OF THE INVENTION

The object of this invention is to provide a solar concentrator design that can create a flat solar reflector capable of being retracted and stowed.

Another objective is to provide a solar concentrator whose reflector panels can be retracted for launch without rendering the solar panel ineffective and is lighter in weight than a conventional trough reflector system.

These and other objectives are accomplished through the use of flexible solar concentrator reflector panels made of a thin plastic material coated with aluminum or silver, with the flexible reflector panel stretched taut by a system of catenary-like suspension wires around its four edges to create a flat reflector for even distribution of sunlight on the photovoltaic panel, with two reflector panels configured as a trough along the long edges of the solar panel tilted so as to direct the reflected sunlight onto the solar panel so that the ray from the extreme outer edge of a reflector panel will fall on the edge of the opposite side of the solar panel.

The flexible reflector panels are stowed during launch by rolling the reflectors around the booms, or by rolling them about themselves and confining them between booms. For launch, the booms and rolled reflector panels are stowed against the long edges of the solar panel. After launch, the booms are first deployed to an angle with respect to the solar panel, and then a system of pulleys and wires keep the booms parallel to each other to maintain tension on the suspension wires of the reflector panels as the reflector panels are deployed as the plurality of sections of the solar panel are extended to a flat position.

BRIEF DESCRIPTION OF THE DRAWINGS

FIG. 3 shows the thin film solar concentrator partially deployed.

DETAILED DESCRIPTION OF THE PREFERRED EMBODIMENT

Figure 1:
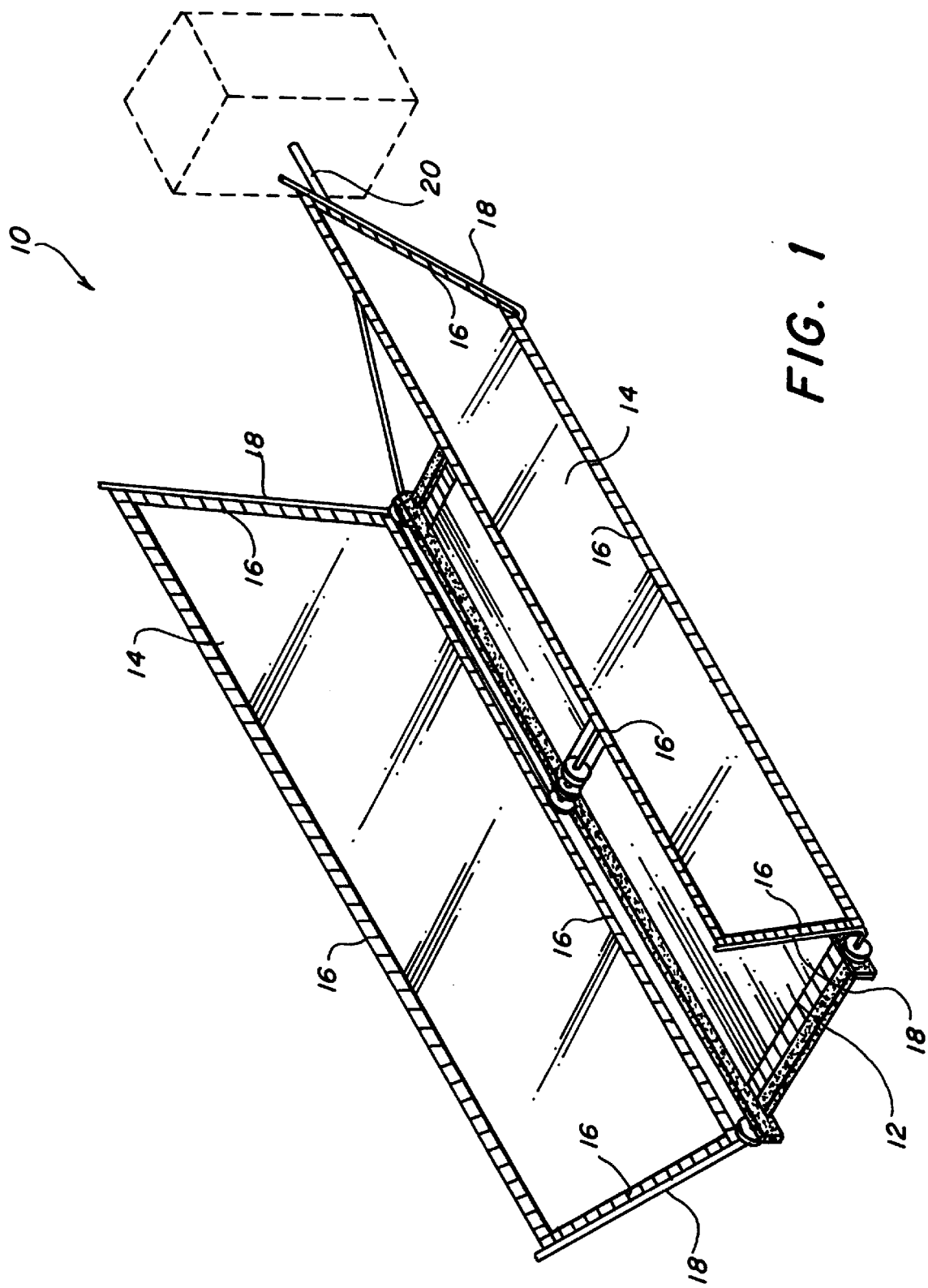
FIG. 1 shows the thin film solar concentrator fully deployed.

The retractable thin film solar concentrator 10, as shown in FIG. 1, for use on a spacecraft, describes a low power concentrator. The configuration is a trough, consisting of a rectangular solar panel 12, comprised of a plurality of photovoltaic cells (not shown) with flexible flat reflector panels 14 along the long edges of the solar panel 12, tilted so as to direct the reflected sunlight onto the solar panel 12 so that the ray from the extreme outer edge of a reflector panel 14 will fall on the edge of the opposite side of the solar panel 12. This results in an even distribution of reflected sunlight on the solar panel 12, which is essential to optimum performance. With this design the maximum theoretical concentration ration is 3:1, the concentration ratio being defined as the ratio of area of sunlight gathered to the area of photovoltaic cells on which the sunlight is concentrated.

In the retractable thin film solar concentrator 10 the reflector panel 14 is a thin plastic film (approximately 0.025 mm) with one surface having a very thin aluminum or silver coating (800 to 1000 Å thick) to make it reflective. A system of catenary like suspension wires 16 around the outer perimeter of the reflector panel 14 maintains its configuration and provides an even tension in all directions to retain the thin plastic film in a flat configuration. The suspension wires, made of Kevlar® or a similar material, are supported by booms 18, made of composite materials, at the four corners of the reflector panel 14. The booms 18 are in turn mounted at the extreme ends of the solar panel 12.

Figure 2A:
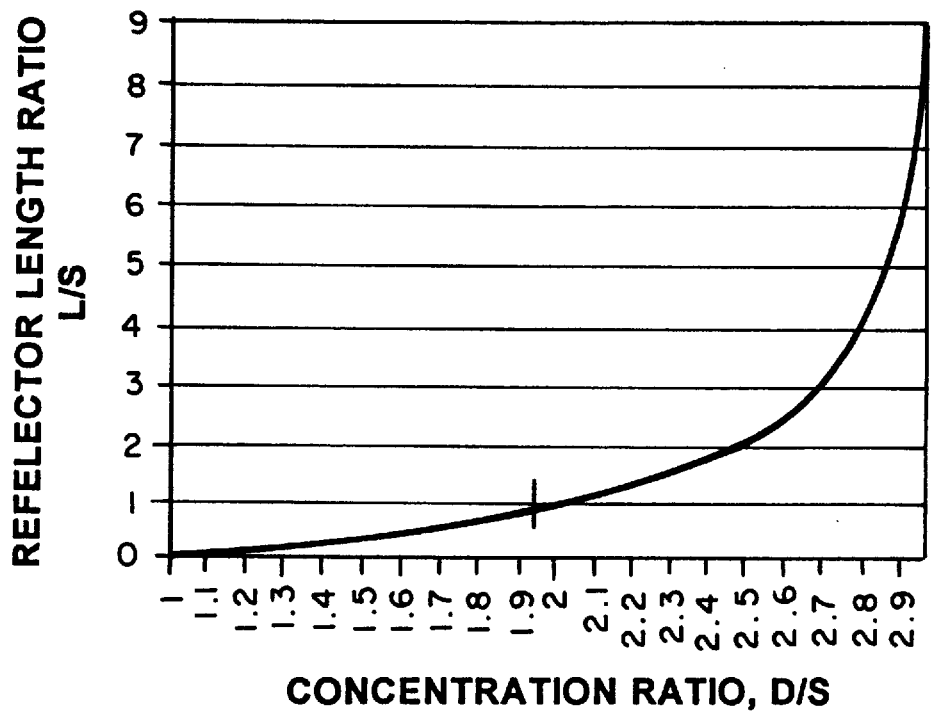
FIG. 2a shows concentration ratio, D/S, vs reflector length ratio, L/S.
Figure 2B:
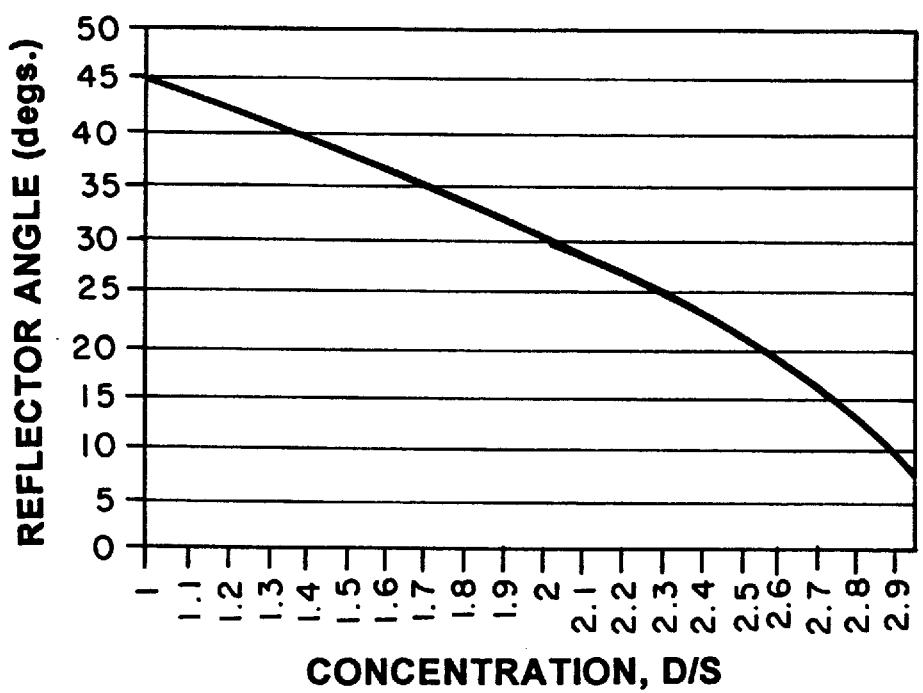
FIG. 2b shows the concentrator ratio, D/S, vs reflector angle, deg.
Figure 2C:
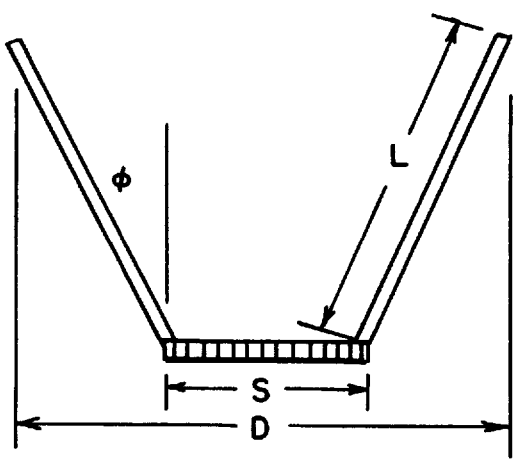
FIG. 2c shows the dimensional designations for computation of reflector length ratio and reflector angle.

Using the graphs in FIG. 2a and 2b, the required reflector length ratio, L/S, and reflector angle, φ in degrees, for a desired concentration ratio, D/S, can be determined. Where, S is the solar panel width in inches, L is the reflector width in inches, D is the width across the reflector panels at the outer extremity, and φ is the angular slope of the reflector panel with respect to the solar panel in degrees, as shown in FIG. 2c. For example, for a desired concentration ratio, D/S, of 2.5, L/S equals approximately 2.2 and φ equals approximates 22 degrees.

The flexible reflector panels 14 are stowed during launch by rolling then around the booms 18, in the direction indicated by the arrows 28, similar to a window shade being rolled up, as shown in FIG. 3. The booms 18, with the reflector panel 14 rolled thereon, are then stowed against the long edges of the solar panel 12 when it is folded on itself. The reflectors may also be stowed by rolling them up on themselves and holding them in interlocking fingers between the pairs of booms on each side of the array. After launch, the booms 18 are extended to an angular position respective to the solar panel 12, a system of pulleys 22 and wires 24 keep the booms parallel to each other, and keep tension on the reflector panels 14 as the reflector panels 14 are deployed when the plurality of sections of the solar panel 12 are extended to a flat position by torsion springs, between the panel sections, or by an extendable mast or boom 26 driven by actuators (not shown) on the spacecraft.

Since the reflector panels 14 and booms 18 stow along the long edges of the solar panel 12, instead of being folded across the width of the solar panel 12 as taught in the prior art for a trough system, the reflector panels 14 may be wider than the solar panel 12, resulting in a higher concentration ratio than achieved in prior art systems. The reflector panels 14, in the stowed position do not block sunlight from the outer solar panel 12, as in the prior art where the reflector folds over the solar panel 12. This allows the solar panel 12 to generate some power for the spacecraft before the solar array is deployed. The solar panels 12 used with this invention are of a conventional design well known to those skilled in the art.

Although the invention has been described in relation to the exemplary embodiment thereof, it will be understood by those skilled in the art that other variations and modifications can be affected in the preferred embodiment without detracting from the scope and spirit of the invention as set forth in the claims.

What is claimed is:

1. A solar concentrator for a spacecraft comprised of:

a plurality of photovoltaic cells combined so as to form a rectangular solar panel for generating electrical power;

booms placed at an angle to the plane of the solar panel at the solar panel corners;

prior to launch, a plurality of reflector panels wrapped around the booms and folded in such a manner as to allow the solar panel to generate electrical power without the reflector panels being extended; and means for extending the reflector panels after launch of the spacecraft so as to position said reflector panels on either side of the solar panel in a trough configuration to provide a predetermined concentration ratio.

2. A solar concentrator, as in claim 1, wherein the reflector panels are made of a plastic sheet coated with aluminum.

3. A solar concentrator, as in claim 1, wherein the reflector panels are made of a plastic sheet coated with silver.

4. A solar concentrator, as in claim 1, wherein the reflector panels are further comprised of catenary suspension wires placed around the outer perimeter of the reflector panel, and attached to the booms, to maintain the reflector panels configuration and provide an even tension in all directions so as to retain the reflector panel in a flat configuration.

5. A solar concentrator, as in claim 1, wherein the means for extending the reflector panels is a combination of wires and pulleys actuated by a torsion springs between the solar panels from the spacecraft.

6. A solar concentrator, as in claim 1, wherein the means for extending the reflector panels is a combination of wires and pulleys actuated by a boom from the spacecraft.

7. A solar concentrator for a spacecraft comprised of:

a plurality of photovoltaic cells combined so as to form a rectangular soar panel for generating electrical power;

booms placed at an angle to the plane of the solar panel at the solar panel corners;

prior to launch, a plurality of reflector panels made of aluminum wrapped around the booms and folded in such a manner as to allow the solar panel to generate electrical power without the reflector panels being extended;

a combination of wires and pulleys actuated by torsion springs between the solar panels from the spacecraft for extending the reflector panels after launch of the spacecraft so as to position said reflector panels on either side of the solar panel in a trough configuration to provide a predetermined concentration ratio; and catenary suspension wires placed around the outer perimeter of the reflector panel, and attached to the booms, to maintain the reflector panels configuration and provide an even tension in all directions so as to retain the reflector panel in a flat configuration when extended.

* * * * *